United States Patent
Lee et al.

(10) Patent No.: US 7,074,716 B2
(45) Date of Patent: Jul. 11, 2006

(54) METHOD OF MANUFACTURING A SEMICONDUCTOR DEVICE

(75) Inventors: Jae Suk Lee, Icheon-Si (KR); Ji A Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/195,986

(22) Filed: Aug. 2, 2005

(65) Prior Publication Data

US 2006/0003578 A1    Jan. 5, 2006

Related U.S. Application Data

(62) Division of application No. 10/733,884, filed on Dec. 3, 2003.

(30) Foreign Application Priority Data

Dec. 16, 2002    (KR) ............... 10-2002-0080224

(51) Int. Cl.
*H01L 21/4763* (2006.01)
(52) U.S. Cl. ............... 438/637; 438/638; 438/687
(58) Field of Classification Search ......... 438/637, 438/638, 666, 687
See application file for complete search history.

(56) References Cited

U.S. PATENT DOCUMENTS

| | | | |
|---|---|---|---|
| 5,918,149 A | 6/1999 | Besser et al. | |
| 6,326,301 B1 * | 12/2001 | Venkatesan et al. | ........ 438/638 |
| 6,380,003 B1 | 4/2002 | Jahnes et al. | |
| 6,498,399 B1 | 12/2002 | Chung et al. | |
| 6,734,090 B1 | 5/2004 | Agarwala et al. | |

* cited by examiner

*Primary Examiner*—Trung Dang
(74) *Attorney, Agent, or Firm*—Andrew D. Fortney

(57) ABSTRACT

The present invention relates to a method of manufacturing a semiconductor device which may stably transfer an electrical signal by forming a plurality of via holes and contact holes to an underlying conductive layer. According to the present invention, even though a contact or via is electrically shorted, it is possible to stably transfer the electrical signal through the other contact hole(s) or via hole(s). The present method includes: forming a first conductive line on a semiconductor substrate; forming an insulating layer on the semiconductor substrate and the first conductive line; forming a plurality of via holes by selectively etching the insulating layer in order to expose the first conductive line; forming a metal barrier on top of the insulating layer and in the via holes; and forming a plug by depositing a conductive layer sufficiently to fill the via holes, and then planarizing the conductive layer to coplanarity with the insulating layer.

12 Claims, 4 Drawing Sheets

METHOD OF MANUFACTURING A SEMICONDUCTOR DEVICE

This is a division of application Ser. No. 10/733,884, filed Dec. 3, 2003.

BACKGROUND OF THE INVENTION

1. Field of the Invention

The present invention relates to a method of manufacturing a semiconductor device which may stably transfer an electrical signal by forming a plurality of via holes and contact holes to an underlying conductive layer. According to the present invention, even though a contact hole or via hole is electrically shorted, it is possible to stably transfer electric signal through the other contact holes or via holes.

2. Description of the Background

Generally, with higher integration of semiconductor devices, a conductive line becomes narrower. The narrowing of the conductive line may cause an increase of resistance in the conductive line and a delay of signal transfer. To solve the problem of signal transfer delay, a multi-layered conductive line structure has been introduced instead of the existing single layered conductive line structure.

However, in the multi-layered conductive line structure, an interval between conductive lines is further decreased so that parasitic capacitance between conductive lines on the same layer is increased and signal transfer delay of the semiconductor device further deepens. Particularly, in case of a conductive line with finer line width, signal transfer delay by parasitic capacitance between conductive lines has a marked effect on operational features of semiconductor devices (such as signal transmission speed). To reduce parasitic capacitance between conductive lines, it is preferable to reduce the thickness of conductive line and to thicken a second insulating layer. Accordingly, many proposals have been provided, wherein the conductive line is formed of low specific resistance material, for example, copper presently used, and the second insulating layer is formed of low permittivity materials. However, in case of copper, since vapor pressure of etching by-products is low, it is difficult to perform a dry etching.

One solution to this problem involves a damascene process, which forms a copper conductive line by forming a via hole or contact hole through the second insulating layer, filling the via hole or contact hole with copper and planarizing the copper layer.

The copper conductive line adapted to the damascene structure has excellent electrical conductivity and low resistance compared with an aluminum or aluminum alloy conductive line, thus enabling finer conductive features and high integration of the conductive line while maintaining constant carrier current. The copper conductive line also has excellent electroplating characteristics, thus increasing reliability of the semiconductor device.

A dual damascene process is performed according to the following steps.

First, in a state where a lower conductive line is formed on a semiconductor substrate, a second insulating layer is formed on top of the substrate and the lower conductive line, and a certain portion of the second insulating layer is etched and removed as to expose the lower conductive line, thus forming a via hole and a trench. Then, a thin metal barrier is formed in the via hole and the trench in order to be in contact with the exposed lower conductive line, and a conductive layer, for example, a copper layer, is deposited to completely fill the via hole and the trench. Then, the copper layer is planarized with the second insulating layer, simultaneously forming a plug and an upper conductive line in the via hole and the trench.

Recently, as the design rules of semiconductor devices are refined, line widths of via holes and trenches are also narrowed. Thus, conductive layers such as the copper layer do not always completely fill the via hole and the trench, thus causing a problem in that a contact characteristic with the lower conductive line is degraded or the device fails as a result of an electrical short.

In the conventional damascene or dual damascene process, one via hole and one trench are formed for the plug and the upper conductive line. Thus, when the conductive layer does not completely fill the via hole and trench, an incomplete contact with the lower conductive line results, and a disconnection between the upper and lower conductive lines may be caused, degrading the electrical characteristics of the entire semiconductor device.

U.S. Pat. No. 5,918,149 (assigned to Advanced Micro Devices, Inc.), issued Jun. 29, 1999, discloses a method of improving an embedment property of the conductive layer in the via hole and trench. However, the method does not provide a fundamental solution for resolving the problem of degrading electrical characteristic due to the incomplete filling of the conductive layer.

SUMMARY OF THE INVENTION

Accordingly, the present invention has been made to solve the above-mentioned problems, and an object of the present invention is to provide a method of manufacturing a semiconductor device, which may stably transfer an electrical signal by forming a plurality of via holes and contact holes to an underlying conductive layer.

In order to accomplish at least the above object, in whole or in part, there is provided a method of manufacturing a semiconductor device, including: forming a first conductive line on a semiconductor substrate; forming an insulating layer on top of the semiconductor substrate and the first conductive line; forming a plurality of via holes by selectively etching the insulating layer in order to expose the first conductive line; forming a metal barrier on the insulating layer and in the via holes; and forming a plug by depositing a conductive layer to sufficiently fill the via holes; and then planarizing the conductive layer until it is substantially coplanar with the insulating layer.

The first conductive line and the plug may be formed of copper.

According to the present invention, a plurality of connecting portions of the conductive lines, i.e., contact holes or via holes, of the semiconductor device are formed so that even upon disconnection of one contact hole or via hole, an electrical signal is stably transferred through another contact hole or via hole.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
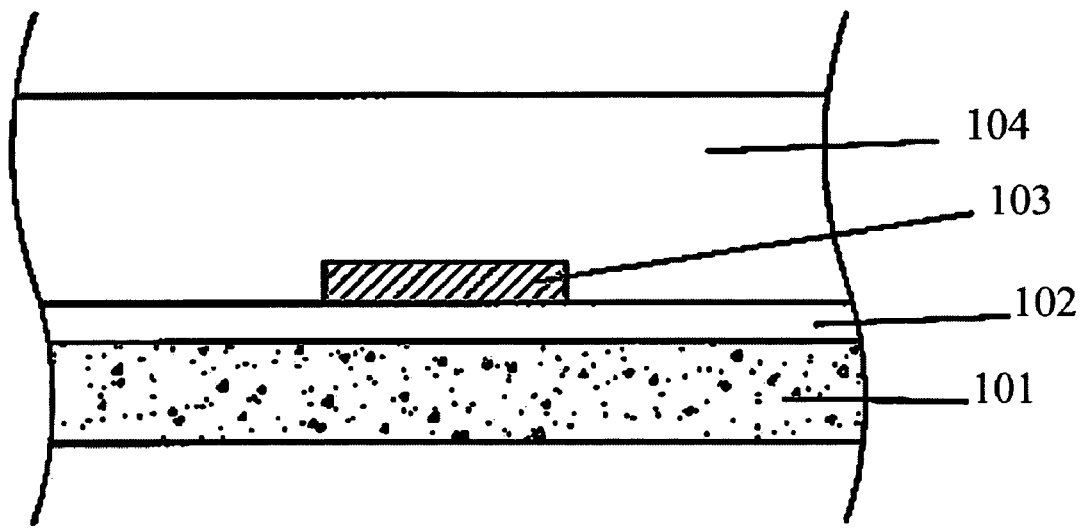
FIGS. 1 to 8 illustrate a method of manufacturing a semiconductor device according to the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 1 to 8 illustrate a method of manufacturing a semiconductor device according to the present invention.

First, as shown in FIG. 1, a first insulating layer 102 is deposited on a semiconductor substrate 101 using a chemical vapor deposition (CVD) process. The semiconductor substrate 101 may be a semiconductor substrate having an impurity diffusion region (not shown), or a lower conductive line.

A first conductive line 103 is formed by performing deposition of a lower metal layer on the first insulating layer by sputtering, etc. and, then, by selectively patterning the lower metal layer using a photolithography process and an etching process.

Then, a second insulating layer 104 is deposited in a certain thickness on top of the substrate, including on the first conductive line 103 and the first insulating layer 102. Herein, the second insulating layer 104 may be composed of Tetra Ethyl OrthoSilicate (TEOS) and/or Spin On Glass (SOG), and the major element thereof is silicon oxide ($SiO_2$).

Then, a certain portion of the second insulating layer is selectively patterned to form (i) a via hole exposing the first conductive line and (ii) a trench etched into the second insulating layer according to a pattern of a second conductive line, an upper conductive line. In the subsequent process, a plug connecting the upper conductive line (the second conductive line) and a lower conductive line (the first conductive line) is formed in the via hole, and the upper conductive line is formed in the trench.

Figure 2:
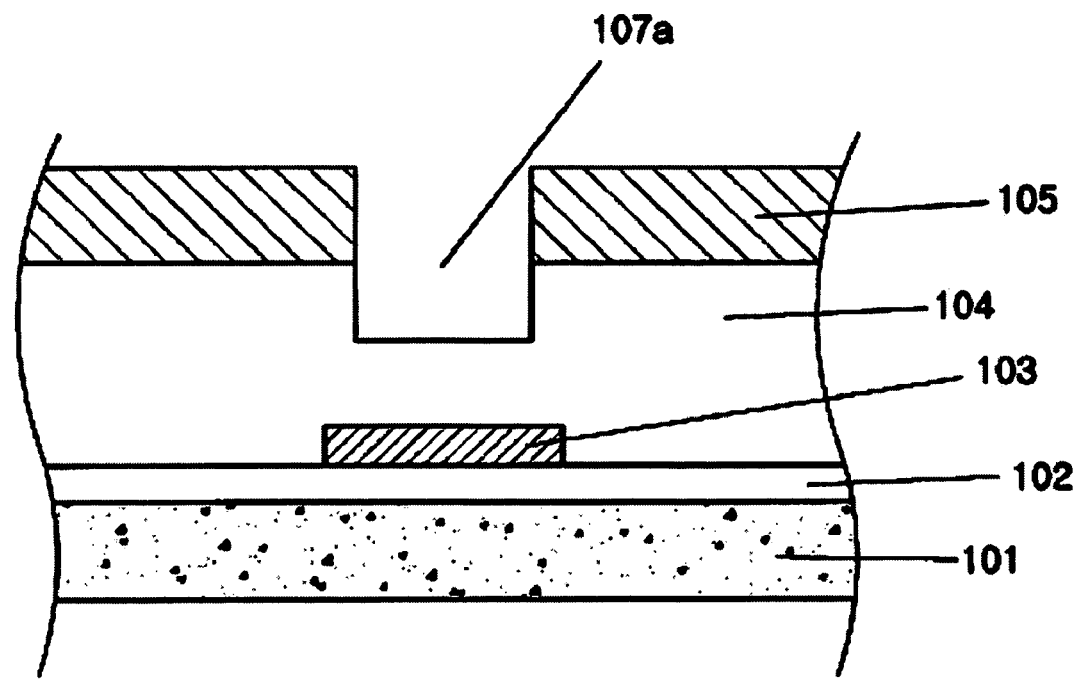
Figure 3:
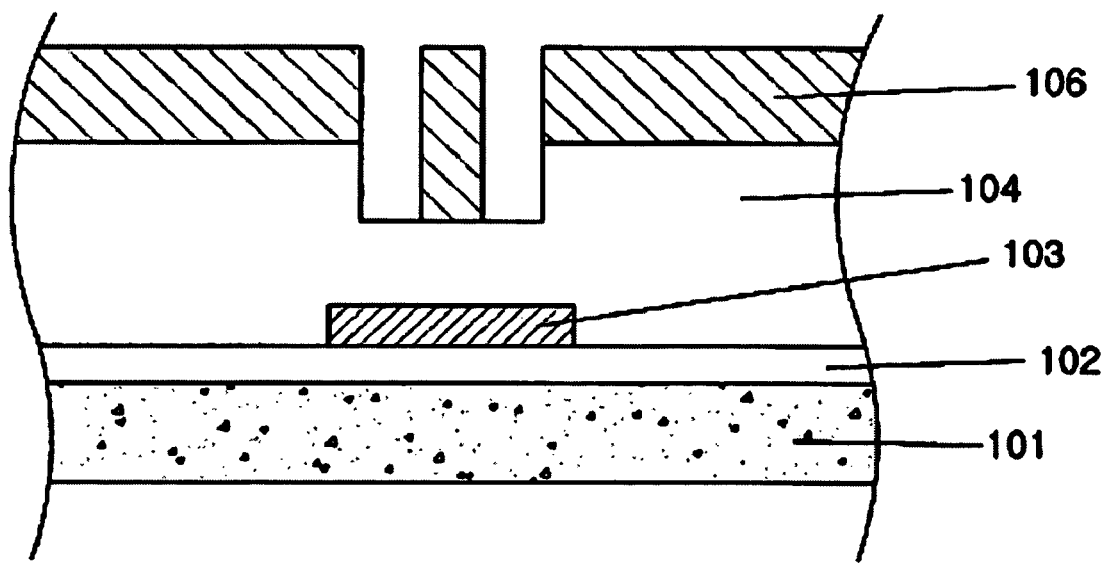
Figure 4:
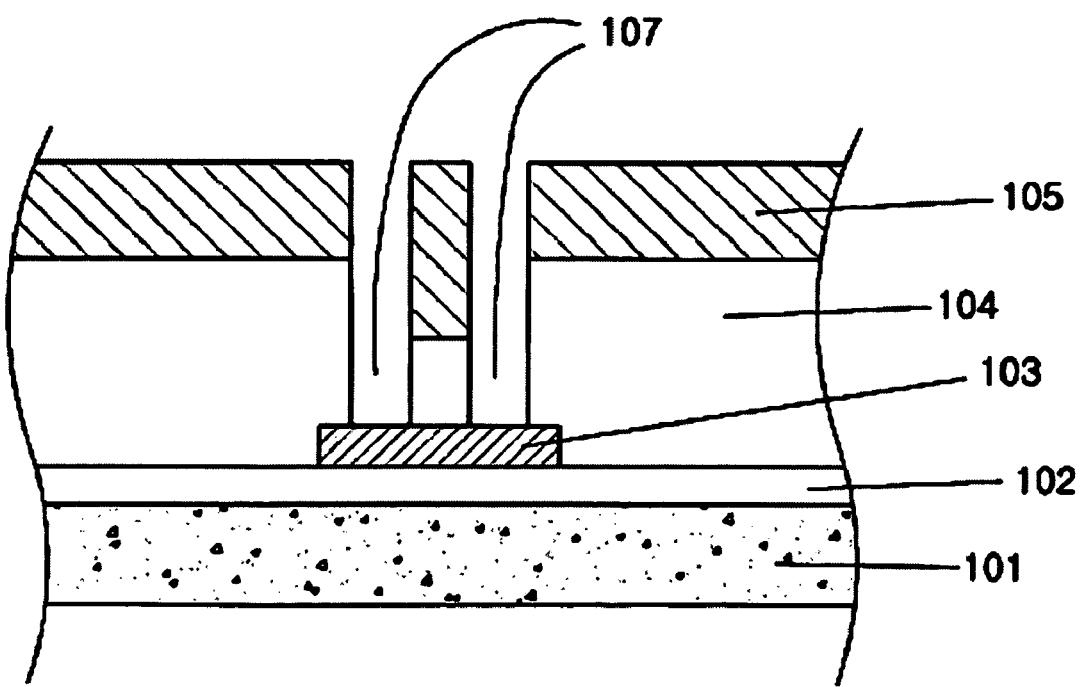

The via hole and the trench are successively patterned according to the steps illustrated in FIGS. 2 to 4.

As shown in FIG. 2, a photoresist is formed on top of the substrate including on the second insulating layer 104, and a first photoresist pattern 105 is formed so as to expose parts 107a of the second insulating layer 104, where a plurality of via holes, multiple via holes, will be formed. Then, using the first photoresist pattern 105 as an etching mask, the exposed parts 107a of the second insulating layer 104 is removed to a certain depth or thickness using a dry etching technique such as a Reactive Ion Etching (RIE).

Herein, the process of removing the parts 107a of the second insulating layer 104 with the dry etching is performed so as not to expose the lower conductive line, and a width of the removed second insulating layer 104 equals an overall width of the multiple via holes of the present invention, the width of a conventional via hole.

Then, as shown in FIG. 3, the first photoresist pattern 105 is removed and a second photoresist pattern 106 is formed on the second insulating layer. A portion exposed by the second photoresist pattern 106 corresponds to respective via hole regions constituting a plurality of via holes.

Then, as shown in FIG. 4, using the second photoresist pattern as an etching mask, the exposed second insulating layer 104 is etched to expose the first conductive line. Herein, the second photoresist pattern defines a plurality of via holes thus to form a plurality of via holes 107 within etched part 107a.

A characteristic feature of the present invention is to form a plurality of via holes through the above-mentioned processes, which processes are herein referred to a via hole adapted to a single Damascene process as an example.

The method of forming the multiple via holes according to the present invention can be adapted to a Dual Damascene process besides the single Damascene process. That is, a plurality of via holes are formed using the second photoresist pattern and, additionally, the trench can be formed using another photoresist pattern (e.g., first photoresist pattern 105 or a third photoresist pattern as described below). The trench formation process and the formation process of the plug and the second conductive line as the upper conductive line in the via hole and the trench will be now described in detail with reference to FIGS. 5 to 8.

Figure 5:
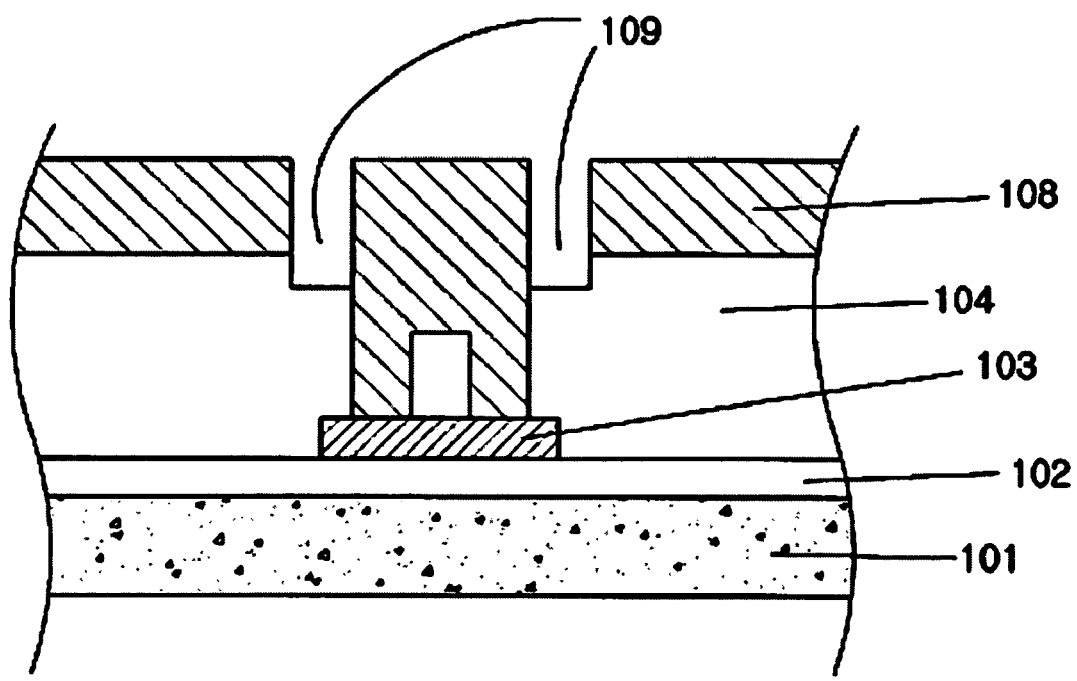
Figure 6:
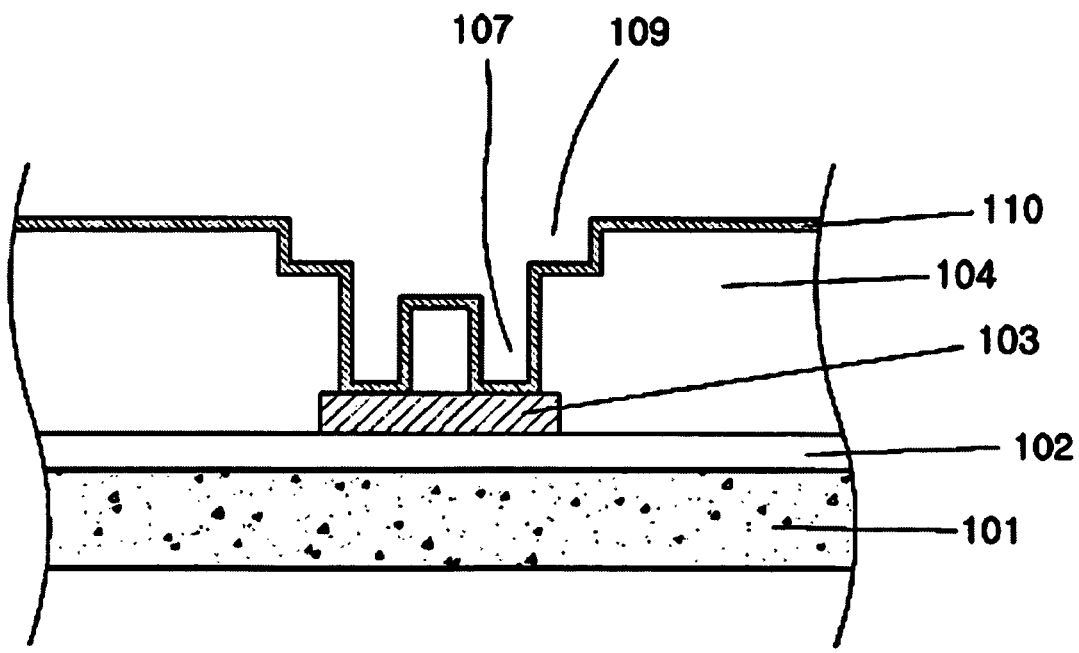

First, as shown in FIG. 5, after the second photoresist pattern 106 is removed, a photoresist is formed on top of the substrate including in the multiple via holes consisting of a plurality of via holes 107 (see, e.g., FIG. 4 or FIG. 6). Then, a third photoresist pattern 108 is formed so as to expose parts of the second insulating layer 104, where trenches will be formed, using a photolithography process. Then, using the third photoresist pattern 108 as an etching mask, the exposed second insulating layer 104 is removed to a certain depth or thickness by etching the exposed second insulating layer.

After the via holes 107 and the trench 109 are formed through the successive processes, as shown in FIG. 6, a metal barrier 110 is formed in the via hole and on the trench. Herein, the metal barrier 110 can be formed by the CVD process of Ti or TiN, or by the sputtering process of Ta or TaN.

Figure 7:
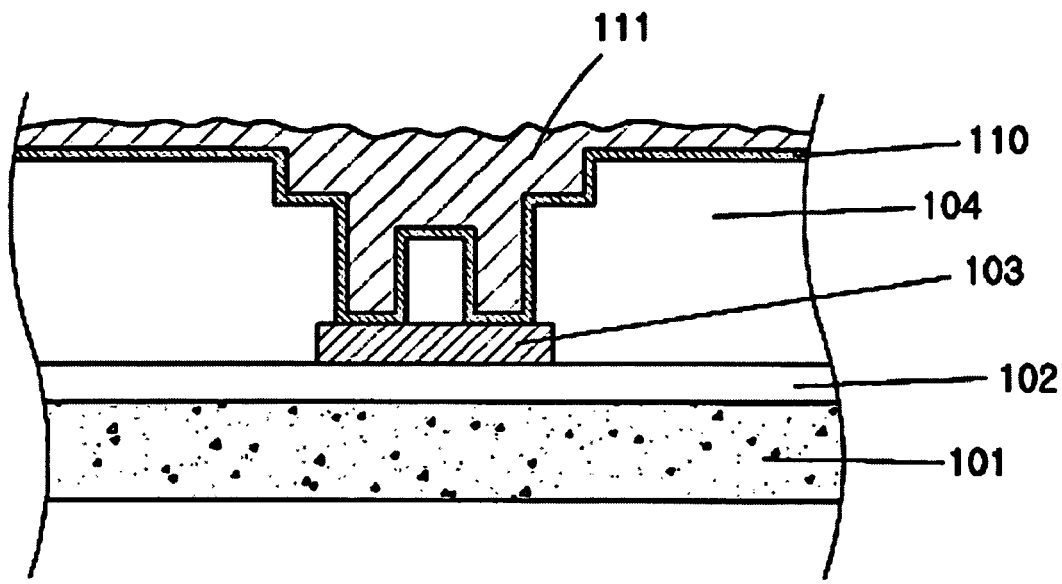

Then, as shown in FIG. 7, in order to form a second conductive line, an upper conductive line on the metal barrier 110, an upper conductive layer 111 such as metal is deposited and formed by CVD or sputtering. Herein, the upper conductive layer 111 can be composed of copper, etc. In case of using copper, a copper seed layer (not shown) for forming a copper bulk layer is deposited and formed on the metal barrier by PVD process and, using an electroplating method employing the copper seed layer, the copper bulk layer is formed on the copper seed layer, in a thickness sufficient to fill the contact hole 107 and the trench 109. Accordingly, a connecting portion between conductive lines and a layer of the upper conductive line are simultaneously formed.

Figure 8:
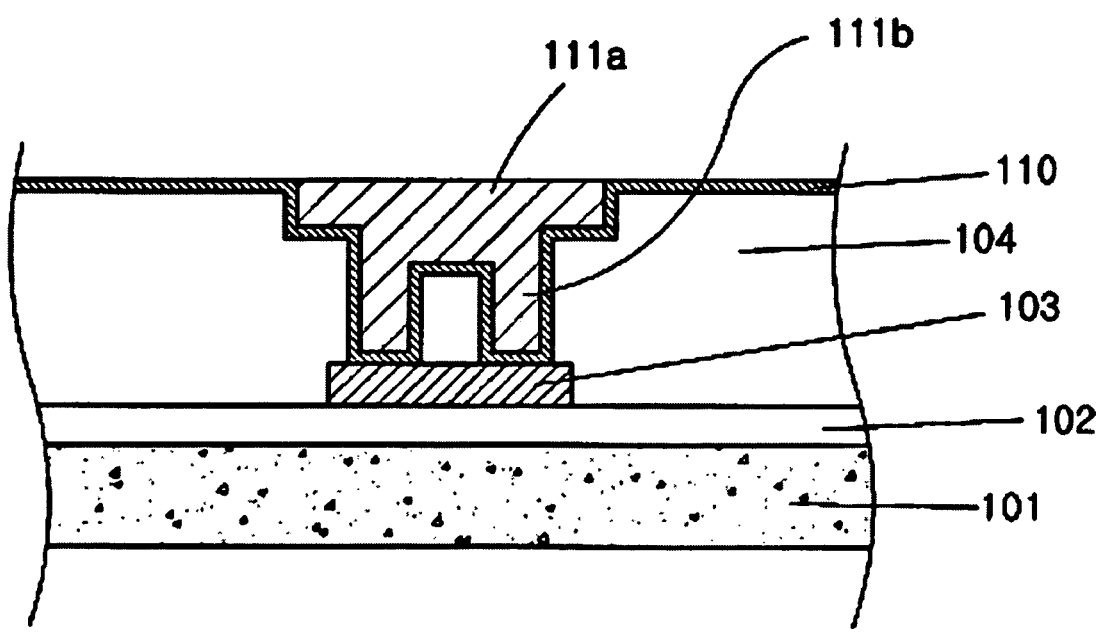

As shown in FIG. 8, the copper bulk layer 111 is planarized to expose the surface of the second insulating layer, thus forming the second conductive line 111b, the upper conductive line electrically connected with the first conductive line 103, and the plug 111a, without a separate patterning process. Herein, planarizing is conducted by a chemical mechanical polishing (CMP) process.

The method of manufacturing the semiconductor device as described above has the following effects.

A plurality of connecting portions of conductive lines, i.e., contact holes or via holes, of the semiconductor device are formed in an area conventionally used for a single contact hole or via hole, so that even upon disconnection of one contact hole or via hole, an electrical signal is stably transferred through the other contact hole or via hole.

Although a preferred embodiment of the present invention has been described for illustrative purposes, those skilled in the art will appreciate that various modifications, additions and substitutions are possible, without departing from the scope and spirit of the invention as disclosed in the accompanying claims.

The entire disclosure of Korean Patent Application No. 10-2002-0080224 filed on Dec. 16, 2002 including specification, claims, drawings and summary are incorporated herein by reference in its entirety.

What is claimed is:

1. A method of manufacturing a semiconductor devices, comprising:

etching a plurality of parts of an insulating layer to a thickness less than a thickness of the insulating layer;

etching a plurality of via holes in each of the plurality of parts, each plurality of via holes exposing a conductive line on a semiconductor substrate;

etching trenches in the insulating layer to a certain thickness different from the thickness of the parts of the insulating layer, each of said trenches enabling electrical connection of a subsequently formed conductive layer through a corresponding plurality of via holes to the exposed conductive line;

forming a metal barrier on the insulating layer and in the via holes and trenches;

depositing a conductive layer in the via holes and trenches sufficiently to fill the via holes and trenches; and planarizing the conductive layer until the conductive layer is substantially coplanar with the insulating layer.

2. The method of claim 1, wherein the trenches are etched before the plurality of via holes are etched.

3. The method of claim 1, wherein the plurality of via holes has a combined width equal to a width of a corresponding insulating layer part.

4. The method of claim 1, further comprising forming the first conductive line by sputtering a metal layer, patterning the metal layer using photolithography, and etching the metal layer.

5. The method of claim 1, wherein the conductive layer and the plug comprise copper.

6. The method of claim 5, wherein forming the plug and depositing the conductive layer comprises depositing a copper seed layer by physical vapor deposition (PVD) and forming a copper bulk layer on the copper seed layer by electroplating.

7. A semiconductor device, comprising:

a first conductive line on a semiconductor substrate;

an insulating layer on the semiconductor substrate and the first conductive line;

a plurality of via holes in each of a plurality of parts of the insulating layer, each of the plurality of via holes exposing the first conductive line, and each of the parts of the insulating layer other than the via holes having a certain thickness greater than zero but less than the insulating layer thickness;

trenches in the insulating layer having a certain thickness different than the thickness of the parts of the insulating layer;

a metal barrier lining the insulating layer and the via holes; and a plug and a conductive layer filling the via holes, the conductive layer being substantially coplanar with the insulating layer.

8. The semiconductor device of claim 7, wherein the first conductive line comprises copper.

9. The semiconductor device of claim 7, wherein the conductive layer and the plug comprise copper.

10. The semiconductor device of claim 7, wherein the metal barrier comprises Ti, TIN, Ta or TaN.

11. The semiconductor device of claim 7, wherein the insulating layer comprises silicon oxide ($SiO_2$).

12. The semiconductor device of claim 7, wherein each of the plurality of via holes has a width equal to a width of a corresponding insulating layer part.

* * * * *